United States Patent
Yu, I et al.

(10) Patent No.: US 8,835,313 B2
(45) Date of Patent: Sep. 16, 2014

(54) INTERCONNECT BARRIER STRUCTURE AND METHOD

(71) Applicant: Taiwan Semiconductor Manufacturing Company, Ltd., Hsin-Chu (TW)

(72) Inventors: Chen-Hua Yu, I, Hsin-Chu (TW); Wen-Chih Chiou, Miaoli (TW); Tsang-Jiuh Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/957,685

(22) Filed: Aug. 2, 2013

(65) Prior Publication Data
US 2013/0316528 A1    Nov. 28, 2013

Related U.S. Application Data

(63) Continuation of application No. 13/222,639, filed on Aug. 31, 2011, now Pat. No. 8,531,035.

(51) Int. Cl.
| | |
|---|---|
| *H01L 21/44* | (2006.01) |
| *H01L 21/4763* | (2006.01) |
| *H01L 23/48* | (2006.01) |
| *H01L 23/00* | (2006.01) |
| *H01L 21/768* | (2006.01) |

(52) U.S. Cl.
CPC ........ *H01L 21/76847* (2013.01); *H01L 23/481* (2013.01); *H01L 2224/03462* (2013.01); *H01L 24/05* (2013.01); *H01L 2224/0401* (2013.01); *H01L 2224/0345* (2013.01); *H01L 21/76898* (2013.01); *H01L 2224/05181* (2013.01); *H01L 2224/05624* (2013.01); *H01L 24/03* (2013.01); *H01L 2224/05647* (2013.01); *H01L 2224/05166* (2013.01); *H01L 2224/05025* (2013.01); *H01L 2224/05548* (2013.01); *H01L 2224/05186* (2013.01)
USPC .......................... 438/667; 438/637; 438/643

(58) Field of Classification Search
USPC ......................................... 438/667, 637, 643
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |

(Continued)

*Primary Examiner* — Luan C Thai
(74) *Attorney, Agent, or Firm* — Slater and Matsil, L.L.P.

(57) ABSTRACT

A system and method for forming through substrate vias is provided. An embodiment comprises forming an opening in a substrate and lining the opening with a first barrier layer. The opening is filled with a conductive material and a second barrier layer is formed in contact with the conductive material. The first barrier layer is formed with different materials and different methods of formation than the second barrier layer so that the materials and methods may be tuned to maximize their effectiveness within the device.

20 Claims, 9 Drawing Sheets

(56) References Cited

U.S. PATENT DOCUMENTS

| | | |
|---|---|---|
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 6,964,922 B2 | 11/2005 | Lee et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,671,355 B2 * | 3/2010 | Kuo et al. .......... 257/3 |
| 7,795,139 B2 | 9/2010 | Han et al. |
| 2002/0182857 A1 | 12/2002 | Liu et al. |
| 2006/0273465 A1 | 12/2006 | Tamura |
| 2010/0130008 A1 | 5/2010 | Smith |
| 2010/0178747 A1 | 7/2010 | Ellul et al. |

\* cited by examiner

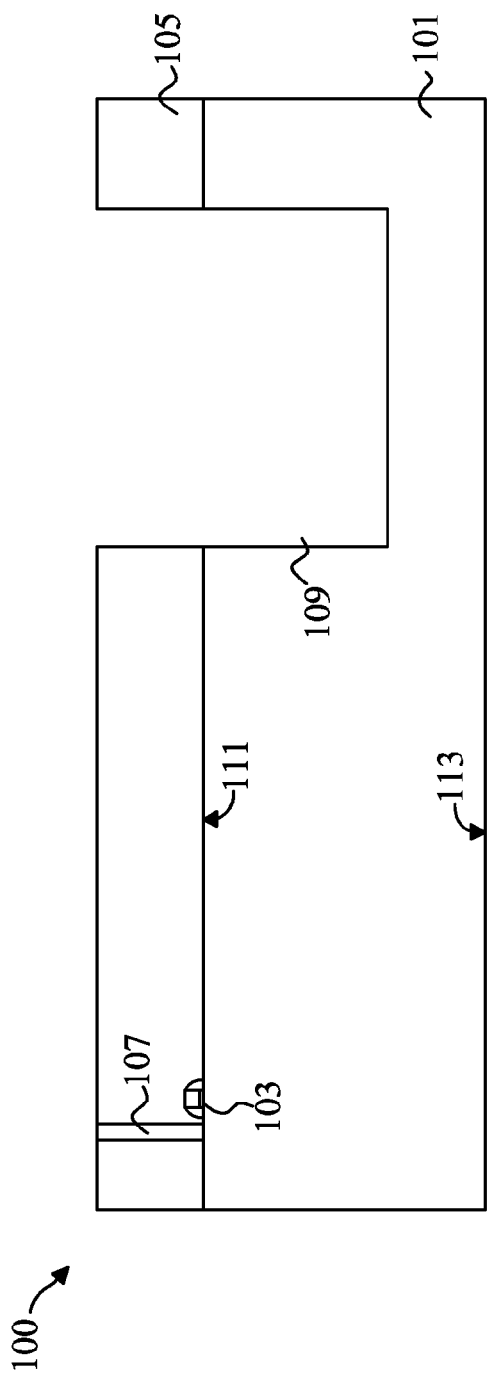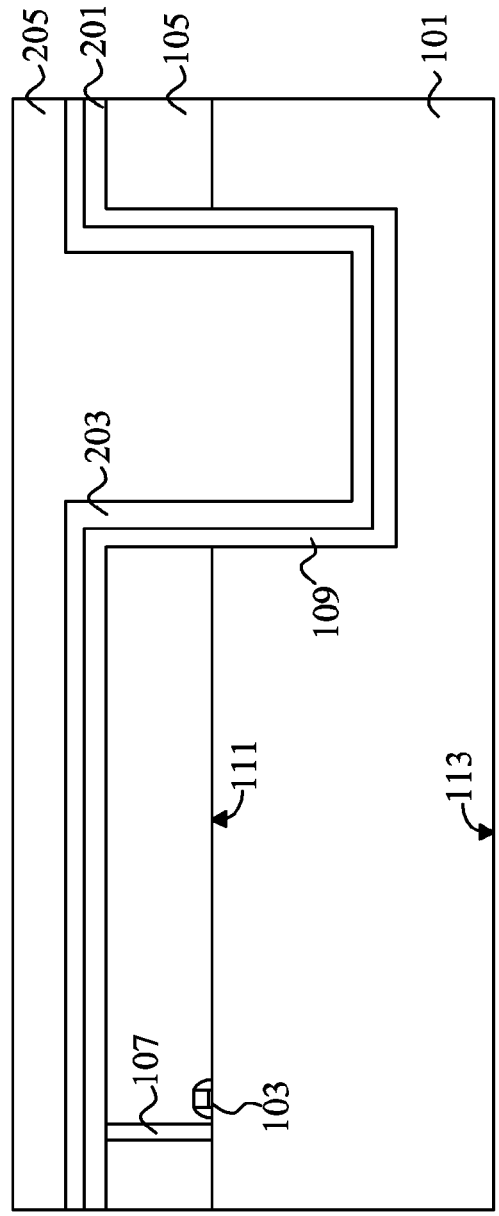

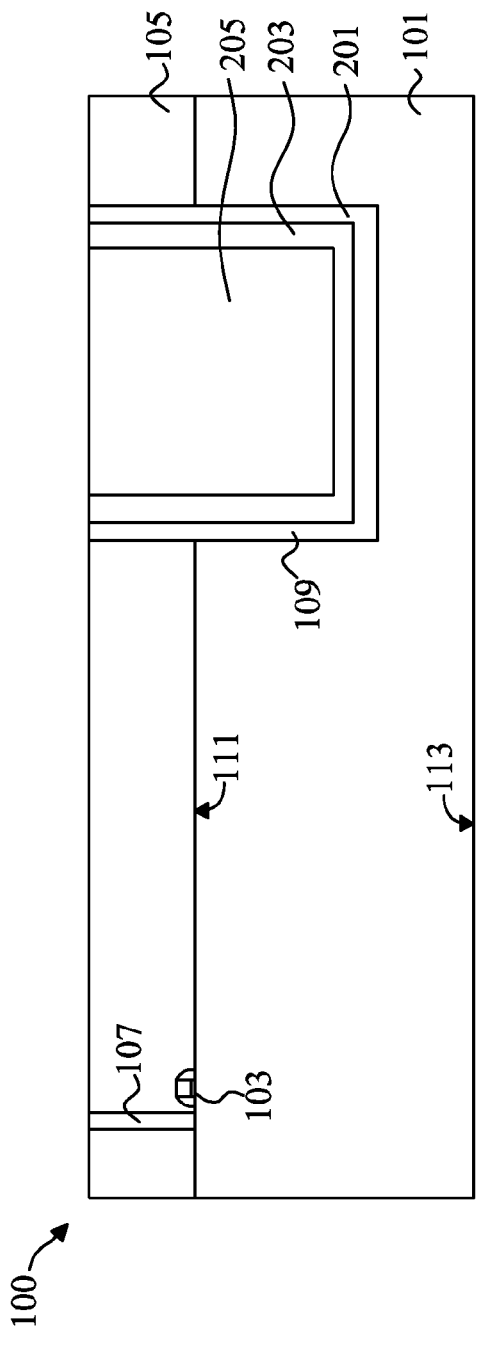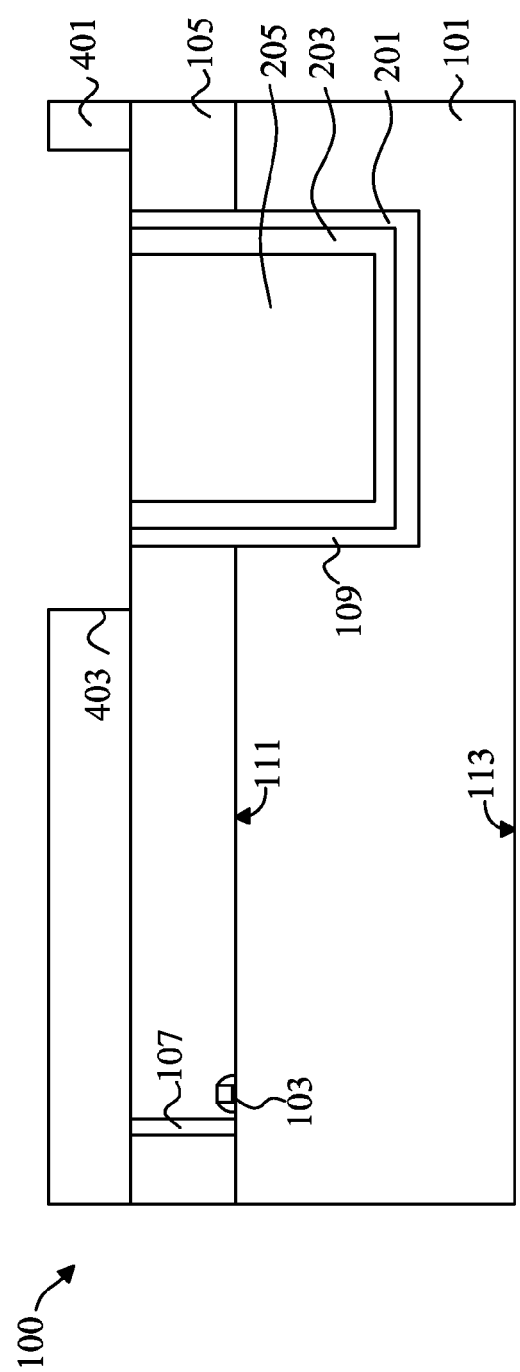
Figure 3
Figure 4

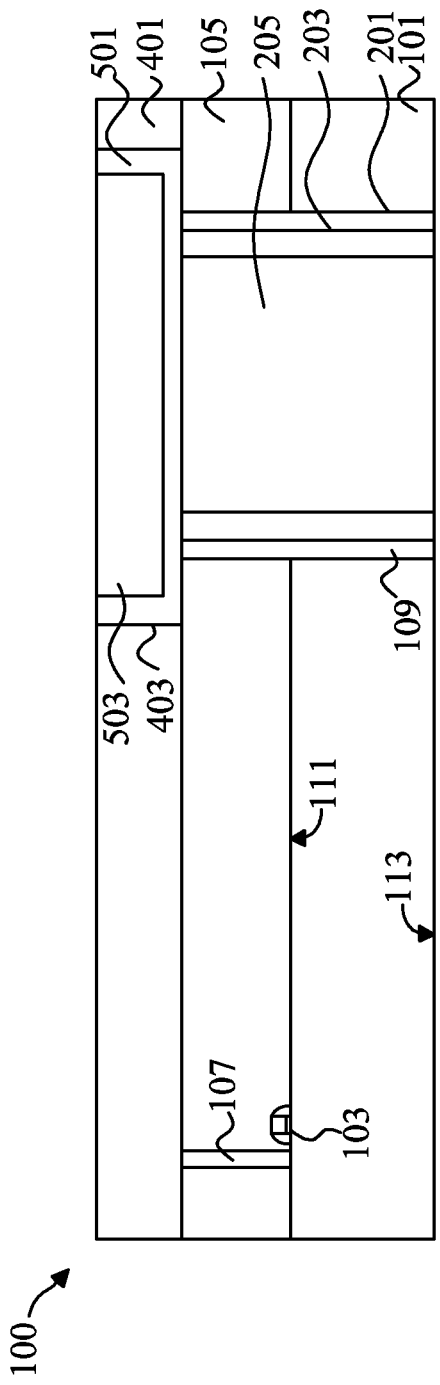
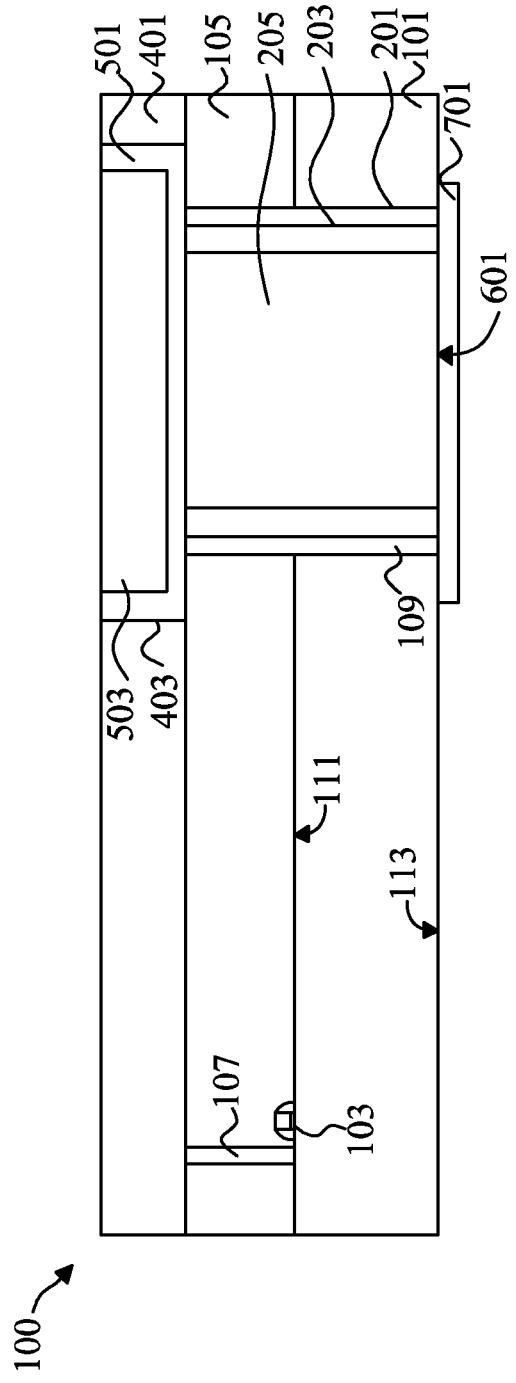

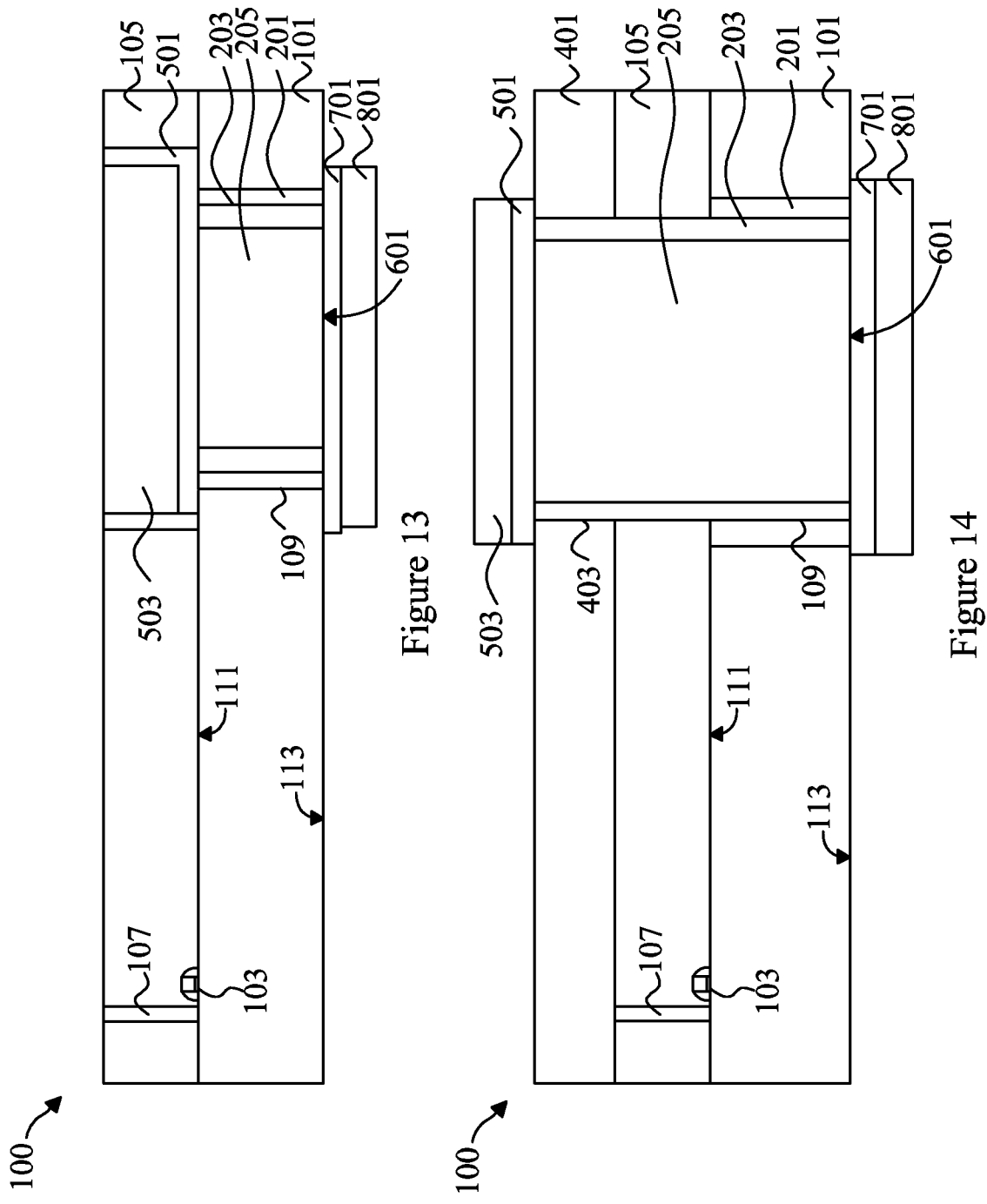

ial. Once the conductive material has been formed, a second
INTERCONNECT BARRIER STRUCTURE AND METHOD This application is a continuation of U.S. patent application Ser. No. 13/222,639, filed on Aug. 31, 2011, and entitled "Interconnect Barrier Structure and Method," which application is hereby incorporated herein by reference.

BACKGROUND

Generally, through substrate vias (TSVs) are formed in a semiconductor wafer by initially forming an opening at least partially through a substrate. A barrier layer is formed to line the opening in order to prevent a later-formed conductive material (e.g., copper) from diffusing into the substrate, where it might deteriorate the overall performance of other devices formed on the semiconductor wafer. As such, this barrier layer prevents damage caused by the conductive material. Once the conductive material has been formed, a second barrier layer may be formed on top of TSV to prevent diffusion of the conductive material that connects to top of TSV, and a third barrier layer may be formed on the bottom of the TSV to prevent diffusion of the conductive material that connects to top of TSV.

However, the processes and materials utilized to form these barrier layers are not ideal for the different and divergent locations where barrier layers may be desired. For example, a process such as physical vapor deposition (PVD) may form a material that has a suitable resistance on the top of the TSV and on the bottom of the TSV. However, such a PVD process does not provide an adequate coverage of the sidewalls (also known as the step coverage of the sidewalls) in high aspect ratio openings such as those utilized for the formation of TSVs. As such, a material formed from a PVD process is not suitable for lining a TSV.

Another process, such as chemical vapor deposition (CVD), may be able to achieve a suitable step coverage along the sidewalls of the TSV in order to prevent conductive material from diffusing out of the TSV. However, CVD also forms a material with a higher resistance than PVD. As such, in order to obtain this step coverage that CVD provides, the higher resistance of a material formed by CVD is also obtained. This tradeoff between step coverage and resistance makes barrier layers formed with CVD less than ideal for the top and bottom of the TSV.

BRIEF DESCRIPTION OF THE DRAWINGS

For a more complete understanding of the embodiments, and the advantages thereof, reference is now made to the following descriptions taken in conjunction with the accompanying drawings, in which:

FIG. 1 illustrates a device with a first opening in accordance with an embodiment;

FIG. 2 illustrates the formation of an isolation layer, a first barrier layer, and a first conductive material in accordance with an embodiment;

FIG. 3 illustrates the planarization of the first conductive material in accordance with an embodiment;

FIG. 4 illustrate the formation of a second inter-layer dielectric and a second opening in accordance with an embodiment;

FIG. 6 illustrates the thinning of a second side of the substrate in accordance with an embodiment;

FIG. 7 illustrates the formation of a third barrier layer in accordance with an embodiment;

FIG. 13 illustrates an embodiment in which the through substrate via extends to the first inter-layer dielectric in accordance with an embodiment; and FIG. 14 illustrates an embodiment in which the through substrate via extends through multiple metallization layers in accordance with an embodiment.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 5:
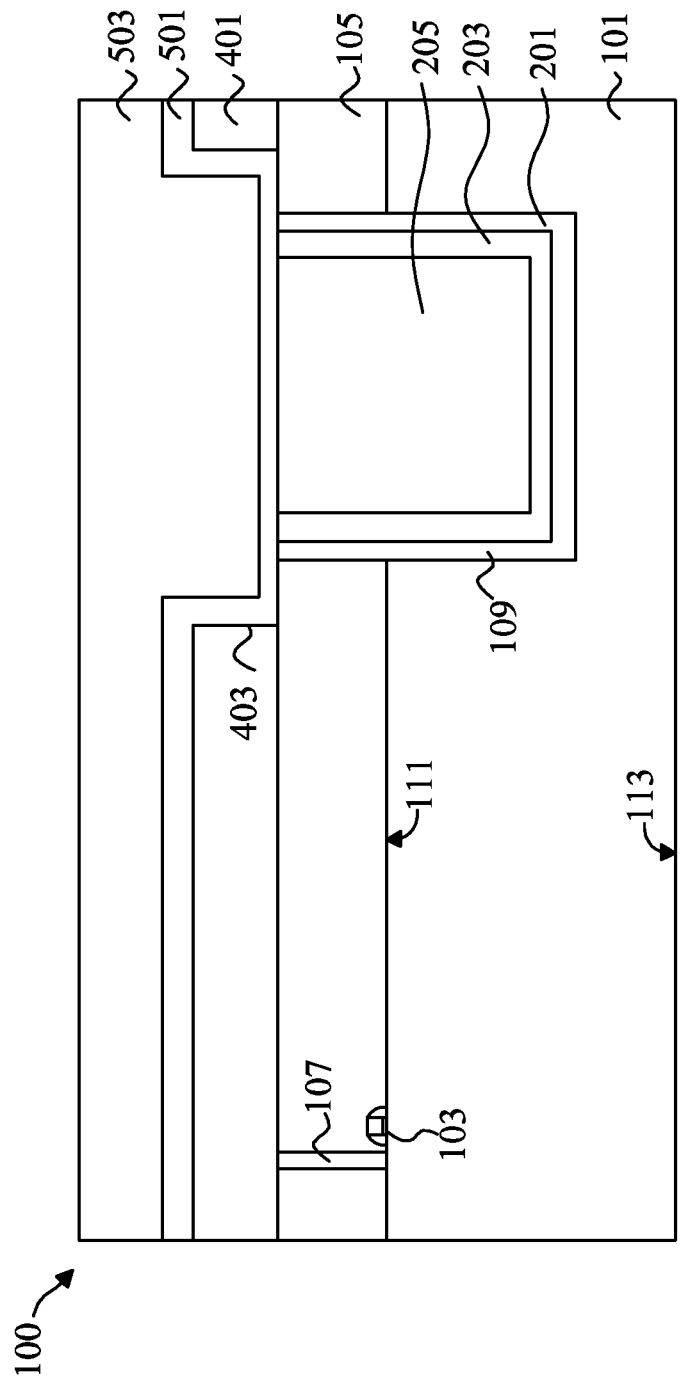
FIG. 5 illustrates the formation of a second barrier layer and a second conductive material in accordance with an embodiment.

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a barrier structure for a through substrate via. The embodiments may also be applied, however, to other barrier structures and/or other interconnection structures.

With reference now to FIG. 1, there is shown a device 100 with a substrate 101, active devices 103 formed on the substrate 101, a first interlayer dielectric (ILD) 105 over the substrate 101, a contact 107 to the active devices 103 through the first ILD 105, and a first opening 109 formed through the first ILD 105 and into the substrate 101. The substrate 101 comprises a first side 111 and a second side 113 opposite the first side 111, and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include glass substrates, multi-layered substrates, gradient substrates, or hybrid orientation substrates.

The active devices 103 are represented on FIG. 1 as a single transistor on the first side 111 of the substrate 101. However, as one of ordinary skill in the art will recognize, a wide variety of passive and active devices such as transistors, capacitors, resistors, inductors, combinations of these, or the like may be used to generate the desired structural and functional requirements of the overall design of the device 100. The active devices 103 may be formed using any suitable methods either within or on the surface of the substrate 101.

The first ILD 105 may be formed to electrically isolate the active devices 103 and the substrate 101 from the overlying metallization layers (not shown) and may be formed over the substrate 101 and active devices 103 by chemical vapor deposition, sputtering, or any other method known and used in the art for forming a first ILD 105. The first ILD 105 typically has a planarized surface and may be comprised of silicon oxide, although other materials, such as low-k materials, could alternatively be utilized. Optionally, the first ILD 105 may be formed so as to impart a strain to the substrate 101 within the active devices 103, which will increase the overall performance of the active devices 103, as is known in the art.

The contact 107 may extend through the first ILD 105 to make electrical contact with at least one of the active devices 103. The contact 107 may be formed through the first ILD 105 in accordance with known photolithography and etching techniques. Generally, photolithography techniques involve depositing a photoresist material, which is masked, exposed, and developed to expose portions of the first ILD 105 that are to be removed. The remaining photoresist material protects the underlying material from subsequent processing steps, such as etching. Photoresist material is utilized to create a patterned mask to define the contact 107. Alternative masks, such as a hardmask, may also be used.

The contact 107 may be formed in those areas in which the first ILD 105 was removed and may comprise a barrier/adhesion layer (not shown) to prevent diffusion and provide better adhesion between the contact 107 and the first ILD 105. In an embodiment, the barrier layer is formed of one or more layers of titanium, titanium nitride, tantalum, tantalum nitride, or the like. The barrier layer may be formed through chemical vapor deposition, although other techniques could alternatively be used. The barrier layer may be formed to a combined thickness of about 10 Å to about 500 Å.

The contact 107 may be formed of any suitable conductive material, such as a highly-conductive, low-resistive metal, elemental metal, transition metal, or the like. In an embodiment the contact 107 may be formed of tungsten, although other materials, such as copper, could alternatively be utilized. In an embodiment in which the contact 107 is formed of tungsten, the contact 107 may be deposited by CVD techniques known in the art, although any method of formation could alternatively be used.

The first opening 109 may be formed by applying and developing a suitable photoresist (not shown), and then etching the first ILD 105 and at least a portion of the substrate 101. The first opening 109 may be formed so as to extend into the substrate 101 at least further than the active devices 103 formed within and on the substrate 101, and at least to a depth greater than the eventual desired height of the substrate 101. Accordingly, while the depth of the first opening 109 from the surface of the substrate 101 is dependent upon the overall design of the desired chip, the depth may be between about 20 µm and about 200 µm, such as about 50 µm. Further, the first opening 109 may have a diameter of between about 2 µm and about 50 µm, such as about 5 µm.

FIG. 2 illustrates the formation of an isolation liner 201, a first barrier layer 203, and a first conductive material 205 over the first ILD 105 and in the first opening 109. The isolation liner 201 may be formed to cover the sidewalls and bottom of the first opening 109. The isolation liner 201 may be either tetraethylorthosilicate (TEOS) or silicon nitride, although any suitable dielectric may alternatively be used. The isolation liner 201 may be formed using a plasma enhanced chemical vapor deposition (PECVD) process, although other suitable processes, such as physical vapor deposition or a thermal oxidation process, may alternatively be used.

The first barrier layer 203 may be formed over the isolation liner 201 and along the sidewalls and bottom of the first opening 109 in order to prevent the migration of the first conductive material 205 out of the first opening 109 and into the surrounding materials such as the substrate 101. The first barrier layer 203 may be formed so as to cover the isolation liner 201 and the sidewalls and bottom of the TSV first opening 109 with a thickness of between about 10 Å and about 2,000 Å, such as between about 20 Å and about 500 Å. The first barrier layer 203 may be formed utilizing a CVD process in order to obtain the step-coverage benefits of the CVD process along the sidewalls of the first opening 109, thereby improving the step coverage (as compared to, e.g., PVD deposition in an opening having a similar aspect ratio) along the sides of the TSV where the resistance is not a critical as other locations (such as the top and bottom of the TSV). However, while CVD may be used to obtain the benefits of CVD, the CVD process is not the only process that may be utilized to form the first barrier layer 203. Other processes, such as PVD and ALD, and any other suitable process to form the first barrier layer 203, may alternatively be utilized, and all such processes are fully intended to be included within the scope of the embodiments.

The first barrier layer 203 may comprise titanium, titanium nitride, tantalum, tantalum nitride, and the like. Additionally, the first barrier layer 203 may be formed as a composite layer, with a first layer of material formed in a first method and a second layer of material formed in a second method, wherein the first layer of material may or may not be the same material and wherein the first method and the second method may or may not be the same methods of formation. For example, in one embodiment the first barrier layer 203 may be a composite layer comprising a first layer of titanium formed through CVD and a second layer of titanium nitride formed through CVD. However, as one of ordinary skill in the art will recognize, this example is intended to be illustrative only and is not intended to be limiting, as any suitable combination of materials and methods may be utilized to form the first barrier layer 203.

The first conductive material 205 may be formed within the first opening 109 utilizing a seed layer (not individually shown in FIG. 2). The seed layer may be deposited over the first barrier layer 203 by PVD or CVD, and may be formed of copper, although other methods and materials may alternatively be used if desired. Additionally, while the thickness of the seed layer will be dependent at least in part on the depth of the first opening 109, the seed layer may have a thickness of between about 50 Å and about 10,000 Å. For example, for a first opening 109 with a depth of about 50 µm, the seed layer may have a thickness of between about 50 Å and about 10,000 Å, such as about 5,000 Å.

Once the seed layer has been formed, the first conductive material 205 may be plated onto the seed layer. The first conductive material 205 may comprise copper, although other suitable materials such as aluminum, alloys, doped polysilicon, combinations thereof, and the like, may alternatively be utilized. The first conductive material 205 may be formed by electroplating copper onto the seed layer, filling and overfilling the first opening 109, although other processes suitable to the desired materials may alternatively be utilized.

FIG. 3 illustrates that, once the first opening 109 has been filled, excess isolation liner 201, first barrier layer 203, seed layer, and first conductive material 205 located outside of the first opening 109 may be removed in order to planarize the first conductive material 205 with the first ILD 105. In an embodiment a chemical mechanical polishing (CMP) process may be utilized wherein chemical and mechanical etching and grinding are utilized to remove and planarize the various layers. However, while a CMP process is described, any suitable removal process may alternatively be used.

FIG. 4 illustrates the formation and patterning of a second ILD 401. The second ILD 401 may be formed over the first ILD 105, and may comprise a dielectric material such as an oxide or silicon nitride, although other suitable dielectrics, such as low-k dielectric or polyimide, may alternatively be used. The second ILD 401 may be formed using a PECVD process, although any other suitable process may alternatively be used. The second ILD 401 may have a thickness of between about 0.5 μm and about 2.0 μm, such as about 1 μm.

Once formed the second ILD 401 may be patterned to form a second opening 403 and to expose at least a portion of the second conductive material 503. The second ILD 401 may be patterned using a suitable photolithographic technique, wherein a light-sensitive photoresist (not shown) is applied to the second ILD 401 exposed and developed to form a photoresist. Once developed, exposed portions of the second ILD 401 may be removed using a suitable etchant to expose at least a portion of the first conductive material 205.

FIG. 5 illustrates the formation of a second barrier layer 501 and a second conductive material 503 within the second opening 403. The second barrier layer 501 may be formed using a process such as PVD to a thickness of between about 10 Å and about 2,000 Å, such as between about 20 Å and about 500 Å. By utilizing PVD in the process to form the second barrier layer 501, the benefits of PVD, such as the lower resistance of PVD over CVD, may be obtained in an area where lower resistance is more preferable than an enhanced step coverage of CVD. However, while PVD allows for the resistance to be reduced between the first conductive material 205 and the second conductive material 503, the formation of the second barrier layer 501 is not limited to PVD, and the second barrier layer 501 may alternatively be formed through other processes, such as CVD, ALD, or any other suitable process.

The second barrier layer 501 may comprise tantalum nitride, although other materials, such as tantalum, titanium, titanium nitride, combinations of these, and the like may alternatively be used. Additionally, the second barrier layer 501 may be a different material than the first barrier layer 203. By having different materials for the second barrier layer 501 than the first barrier layer 203, materials with location specific desired properties can be placed in order to maximize the performance of the overall device 100. In an embodiment, if the first barrier layer 203 is a composite layer of titanium formed by CVD and titanium nitride formed by CVD, the second barrier layer 501 may be a composite layer comprising tantalum nitride formed by PVD and tantalum forming by PVD, in order to take advantage of the lower resistance of tantalum nitride formed by PVD over the first conductive material 205 and the better step coverage of the composite layer between the first conductive material 205 and the isolation liner 201. However, any suitable combination wherein the first barrier layer 203 and the second barrier layer 501 have different compositions of materials, may alternatively be utilized to obtain the benefits of different combinations of materials and methods of formation.

The second conductive material 503, similar to the first conductive material 205 (discussed above), may be formed utilizing a seed layer (not individually shown in FIG. 5) and a plating process. The seed layer may be deposited over the second barrier layer 501 by PVD or CVD, and may be formed of copper, although other methods and materials may alternatively be used if desired. Once the seed layer has been formed, the second conductive material 503 may be plated onto the seed layer. The second conductive material 503 may comprise copper, although other suitable materials such as aluminum, alloys, doped polysilicon, combinations thereof, and the like, may alternatively be utilized. The second conductive material 503 may be formed by electroplating copper onto the seed layer, filling and overfilling the second opening 403.

FIG. 6 illustrates that, once the second opening 403 has been filled, excess second barrier layer 501, seed layer, and second conductive material 503 located outside of the second opening 403 may be removed in order to planarize the second conductive material 503 with the second ILD 401. In an embodiment a chemical mechanical polishing (CMP) process may be utilized wherein chemical and mechanical etching and grinding are utilized to remove and planarize the various layers. However, while a CMP process is described, any suitable removal process may alternatively be used.

FIG. 6 additionally illustrates a thinning of the second side 113 of the substrate 101. In an embodiment, portions of the second side 113 of the substrate 101 may be removed to expose the first conductive material 205 located within the first opening 109 to form a through substrate via (TSV) 601. The removal may be performed with a grinding process such as a chemical mechanical polish (CMP), although other suitable processes, such as etching, or combination of processes, may alternatively be used. The removal of the second side 113 of the substrate 101 may be continued until the substrate 101 has a desired thickness, such as between about 10 μm and about 200 μm, such as between about 25 μm and about 100 μm.

FIG. 7 illustrates the formation of a third barrier layer 701 over the second side 113 of the substrate 101 to cover the first conductive material 205. The third barrier layer 701 may be formed using a process such as PVD to a thickness of between about 10 Å and about 2,000 Å, such as between about 20 Å and about 500 Å.

By utilizing PVD in the process to form the third barrier layer 701, the benefits of PVD, such as the lower resistance of PVD over CVD, may be obtained in an area where lower resistance is more preferable than an enhanced step coverage of CVD. However, while PVD allows for the resistance to be reduced between the first conductive material 205 and the backside conductor 801, the formation of the third barrier layer 701 is not limited to PVD, and the third barrier layer 701 may alternatively be formed through other processes, such as CVD, ALD, or any other suitable process.

The third barrier layer 701 may comprise titanium although other materials, such as tantalum, tantalum nitride, titanium nitride, combinations of these, and the like may alternatively be used. Additionally, the third barrier layer 701 may be similar to the second barrier layer 501 and also may be, similar to the second barrier layer 501, a different material than the first barrier layer 203. By having different materials for the third barrier layer 701 than the first barrier layer 203, the materials can be more specifically tuned in order to maximize their properties. In an embodiment, if the first barrier layer 203 is a composite layer of titanium formed by CVD and titanium nitride formed by CVD, the third barrier layer 701 may be tantalum nitride formed by PVD. However, any suitable combination wherein the first barrier layer 203 and the third barrier layer 701 have different compositions of materials, may alternatively be utilized, and combinations in which the third barrier layer 701 has a different composition than the second barrier layer 501 may also be utilized.

The third barrier layer 701 may be patterned to form a barrier to the first conductive material 205 without covering the entire second side 113 of the substrate 101 using a suitable photolithographic technique, wherein a light-sensitive photoresist (not shown) is applied to the third barrier layer 701 exposed and developed to form a photoresist. Once developed, exposed portions of the third barrier layer 701 may be removed using a suitable etchant to expose at least a portion of the second side 113 of the substrate 101.

Figure 8:
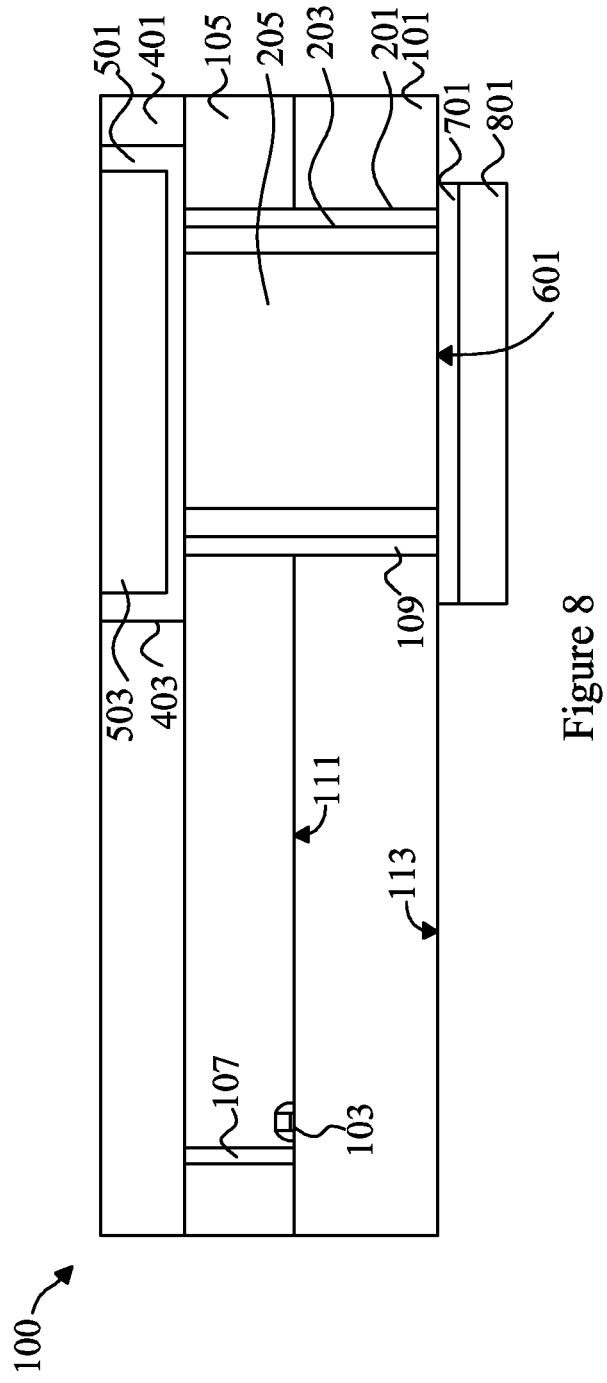
FIG. 8 illustrates the formation of a backside conductor in accordance with an embodiment.

FIG. 8 illustrates the formation of a backside conductor 801 over the third barrier layer 701. The backside conductor 801 may be used to connect the TSV 601 to other internal or external points as, e.g., a redistribution layer or as an external contact for the substrate 101. In one embodiment the backside conductor 801 may be a redistribution layer in which the backside conductor 801 may be used to redistribute the signal from the TSV 601 to another point on the second side 113 of the substrate 101. In this embodiment the backside conductor 801 may comprise a conductive material such as copper. However, the backside conductor 801 may alternatively comprise other materials, such as aluminum, and may also alternatively be comprised of different materials from each other. In an embodiment, the conductive material for the backside conductor 801 may be formed by first applying a seed layer (not shown) over the third barrier layer 701. A photoresist (not shown) may then be formed and patterned in order to expose the seed layer where the backside conductor 801 is desired to be located. The seed layer may then be utilized, for example, in an electroplating process in order to plate the conductive material over the seed layer, thereby forming the backside conductor 801 on the third barrier layer 701 within the patterned photoresist. Once formed, the photoresist and undesired portions of the seed layer (e.g., those portions of the seed layer that were covered by the photoresist) may be removed.

In another embodiment, the backside conductor 801 may be an underbump metallization (UBM) layer used as a landing pad for a conductive connector (not shown) such as a solder bump. In this embodiment the backside conductor 801 may be formed over the TSV 601 using, e.g., an electroplating process and may then be plated using, e.g., an Electroless Nickel Gold (ENIG) process to form an ENIG layer (also not shown). Once the ENIG layer has been formed, a conductive connector, such as a solder ball, may be placed on the ENIG layer and reflowed in order to provide an external connection to the second side 113 of the substrate 101.

Figure 9:
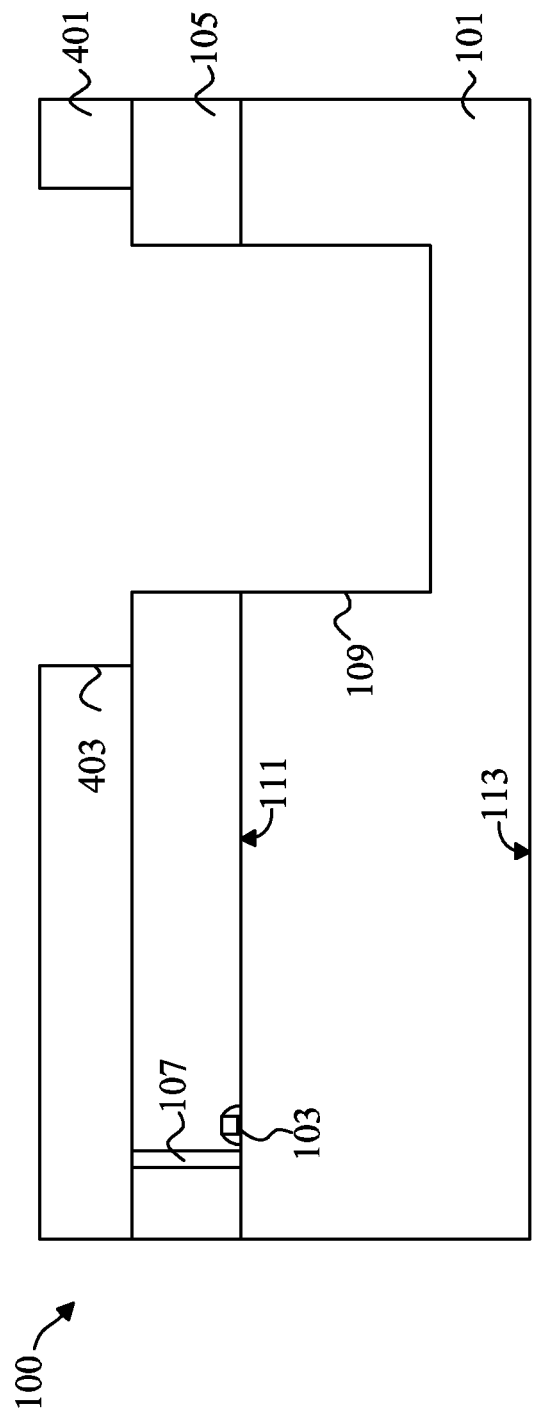
FIGS. 9-12 illustrate the formation of a through substrate via in a dual damascene process in accordance with an embodiment.

In yet another embodiment, the backside conductor 801 may be a copper post in order to provide another type of external connector. In this embodiment the backside conductor 801 may be formed by initially forming a photoresist (not shown) over the second side 113 of the substrate 101 and the third barrier layer 701 and may then be patterned to expose portions of the third barrier layer 701 to which the conductive pillar will make contact. The conductive pillar may be formed within the openings of the photoresist by first forming a seed layer (not shown) and then forming the conductive pillar using the seed layer as an initiator. The conductive pillar may be formed from a conductive material such as copper, although other conductive materials such as nickel, titanium (Ti), vanadium (V), or aluminum (Al), combinations of these, and the like may also be used. Additionally, the conductive pillar may be formed using a process such as electroplating, by a combination of current and immersion within a solution deposit, e.g., copper within the openings in order to fill and/or overfill the openings of the photoresist, thereby forming the conductive pillar. After the conductive pillar has been formed, the photoresist may be removed FIG. 9 illustrates another embodiment in which the TSV 601 may be formed in a dual damascene approach. In this embodiment, rather than forming the first opening 109 in the first ILD 105 prior to forming the second ILD 401, the second ILD 401 may be formed over the first ILD 105, and then the second ILD 401 may be patterned (in, e.g., a similar fashion as the patterning of the second ILD 401 described above with respect to FIG. 3) to form the second opening 403. In an embodiment the second opening 403 may be shaped as a trench as part of an interconnect structure to connect the TSV 601 to other portions of the device 100.

After the second opening 403 has been formed in the second ILD 401, the first opening 109 may be formed through the first ILD 105 and the substrate 101. The first opening 109 may be formed in a similar fashion and to a similar depth as described above with respect to FIG. 1. For example, a suitable photolithographic process may be utilized to form a photoresist or other mask over the second ILD 401 and portions of the exposed first ILD 105 to form the desired shape of the first opening 109, and then an etching process may be used to form the first opening 109 in the substrate 101.

Figure 10:
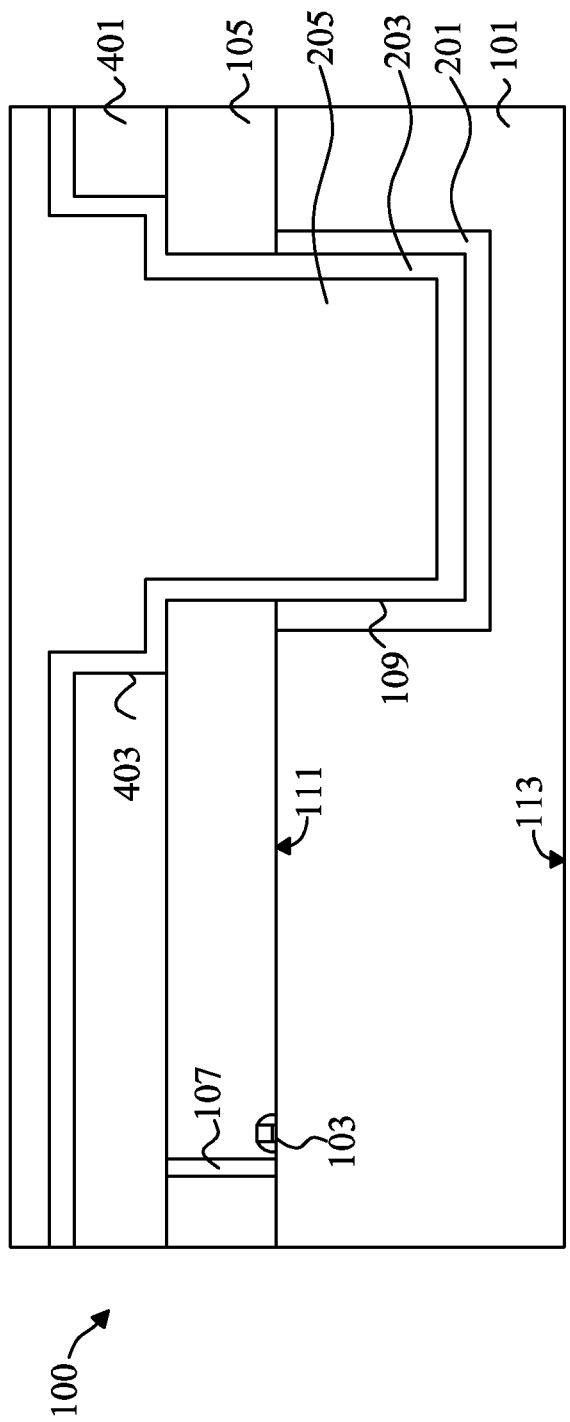

FIG. 10 illustrates the formation of the isolation liner 201, the first barrier layer 203, and the first conductive material 205 into both the first opening 109 and the second opening 403. The isolation liner 201, the first barrier layer 203, and the first conductive material 205 may be formed in a similar process and from similar materials as the processes and materials described above with respect to FIG. 2. For example, an oxidation process may be used to form the isolation liner 201, a CVD process may be used to form the first barrier layer, and an electroplating process may be used to form the first conductive material 205. However, in this embodiment, the first barrier layer 203, and the first conductive material 205 are formed along the sidewalls of the first opening 109 and the second opening 403, thereby forming both the TSV 601 as well as the trench for an interconnect at the same time, thereby simplifying the overall process of manufacturing the device 100.

Figure 11:
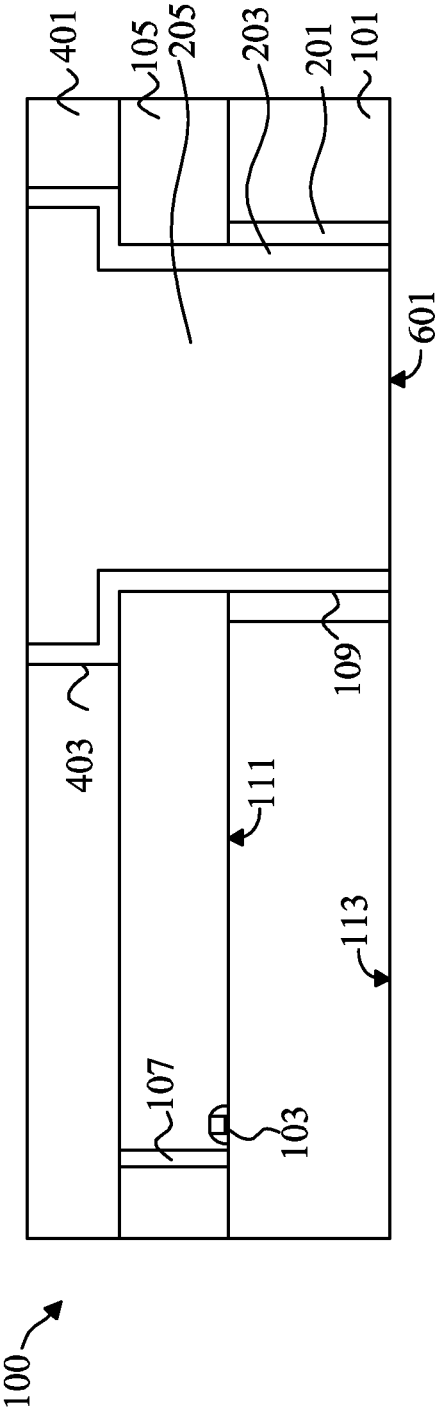

FIG. 11 illustrates that, once the first barrier layer 203 and the first conductive material 205 have been formed, excess first barrier layer 203 and first conductive material 205 located outside of the first opening 109 and the second opening 403 may be removed in order to planarize the first conductive material 205 with the second ILD 401. In an embodiment a chemical mechanical polishing (CMP) process may be utilized wherein chemical and mechanical etching and grinding are utilized to remove and planarize the various layers. However, while a CMP process is described, any suitable removal process may alternatively be used.

FIG. 11 additionally illustrates a thinning of the second side 113 of the substrate 101. In an embodiment, portions of the second side 113 of the substrate 101 are removed to expose the first conductive material 205 located within the first opening 109 to form the TSV 601. The removal may be performed with a grinding process such as a chemical mechanical polish (CMP), although other suitable processes, such as etching, may alternatively be used. The removal of the second side 113 of the substrate 101 may be continued until the substrate 101 has a thickness of between about 10 µm and about 200 µm, such as between about 25 µm and about 100 µm.

Figure 12:
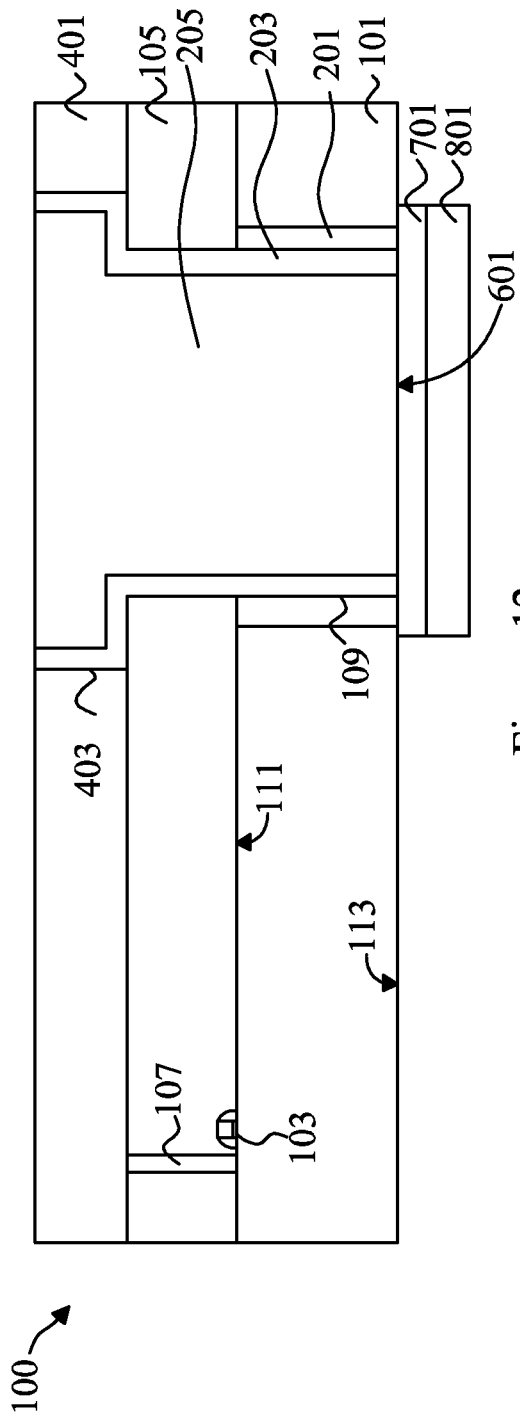

FIG. 12 illustrates the formation of the third barrier layer 701 and the backside conductor 801 over the second side 113 of the substrate 101. In an embodiment the third barrier layer 701 may be formed in a similar fashion and from similar materials as the third barrier layer 701 discussed above with respect to FIG. 9, and may be formed of a different material and/or a different process than the first barrier layer 203. For example, the third barrier layer 701 may comprise tantalum nitride, although other materials, such as tantalum, titanium, titanium nitride, combinations of these, and the like may alternatively be used. Additionally, the third barrier layer 701. By having different materials for the third barrier layer 701 than the first barrier layer 203, the materials can be more specifically tuned in order to maximize their properties. In an embodiment, if the first barrier layer 203 is a composite layer of titanium formed by CVD and titanium nitride formed by CVD, the third barrier layer 701 may be tantalum nitride formed by PVD. However, any suitable combination wherein the first barrier layer 203 and the third barrier layer 701 have different compositions of materials, may alternatively be utilized.

Once formed, the third barrier layer 701 may be patterned and the backside conductor 801 may be formed over the third barrier layer 701. The third barrier layer 701 may be patterned and the backside conductor 801 may be formed using similar processes and materials as described above with respect to FIGS. 7 and 8. For example, the backside conductor 801 may be redistribution layer, a UBM for a conductive connector such as a solder ball, a copper pillar for external connection, or the like.

FIGS. 13-14 illustrate yet other embodiments in which the TSV 601 is formed in a via first approach and a via last approach, respectively. In the via first approach illustrated in FIG. 13, the TSV 601 is formed through the substrate 101 and is not formed through the first ILD 105, with the second barrier layer 501 and the second conductive material 503 formed in the first ILD 105 to provide electrical connection to the TSV 601. In the via last approach illustrated in FIG. 14, the TSV 601 is formed after the various metallization layers and dielectric layers (e.g., the first ILD 105, the second ILD 401, and other metallization and dielectric layers) have been formed, and the TSV 601 is formed through all of the metallization and dielectric layers.

By using different materials and different processes for the formation of the first barrier layer 203 (between the first conductive material 205 and the isolation liner 201 and substrate 101) and the formation of the second barrier layer 501 and third barrier layer 701 (between the first conductive material 205 and other conductive materials), the benefits of each material and process of formation. For example, the enhanced step coverage of CVD may be utilized in areas where resistance is not as great of a concern, while the lower resistance of PVD may be utilized in areas where resistance is a greater concern. By utilizing these different methods and materials, the overall efficiency of the TSV 601 and the overall device may be achieved.

In accordance with an embodiment, a device comprising conductive material extending from a first side of a substrate to a second side of the substrate is provided. A first barrier layer is located between the conductive material and the substrate, the first barrier layer comprising a first material. A second barrier layer is located along the first side of the substrate and the conductive material, the second barrier layer comprising a second material different than the first material. A third barrier layer is located along the second side of the substrate and the conductive material, the third barrier layer comprising a third material different than the first material.

In accordance with another embodiment, a device comprising a first opening through a substrate, the first opening having a first width, the substrate having a first side and a second side is provided. A first dielectric layer is over the first side of the substrate. A second opening is through the first dielectric layer, the second opening having a second width greater than the first width. A first barrier layer is located along sidewalls of the first opening and the second opening, the first barrier layer comprising a first material. A conductive material is located within the first opening and the second opening. A second barrier layer is located along the second side of the substrate over the conductive material, the second barrier layer comprising a second material different from the first material.

In accordance with yet another embodiment, a method of manufacturing a device is provided. The method comprises forming an opening in a first side of a substrate, the opening comprising sidewalls and forming a first barrier layer along the sidewalls of the opening, the first barrier layer comprising a first material, the forming the first barrier layer being performed at least in part by a first process. The opening is filled with a first conductive material and a second barrier layer is formed over the conductive material, wherein the forming the second barrier layer is performed at least in part by a second process different than the first process. A second side of the substrate is thinned to expose the first conductive material within the opening, and a third barrier layer is formed over the conductive material and over the second side of the substrate, wherein the forming the third barrier layer is performed at least in part by a third process different from the first process.

Although the embodiments and their advantages have been described in detail, it should be understood that various changes, substitutions and alterations can be made herein without departing from the spirit and scope of the embodiments as defined by the appended claims. For example, the precise methods utilized to form the barrier layers may be modified while remaining within the scope of the embodiments. Additionally, the substrate may be used to form integrated circuit devices or else may be utilized to form other structures, such as an interposer.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A method of manufacturing a semiconductor device, the method comprising:
    forming a first opening in a substrate, the substrate comprising a first side and a second side opposite the first side;
    depositing a first barrier layer in the first opening using a first process, wherein the first process has a first step coverage;
    filling a remainder of the first opening with a conductive material;
    forming a dielectric layer over the conductive material;
    forming a second opening in the conductive material to expose at least a portion of the conductive material, the second opening having a different width than the first opening;
    depositing a second barrier layer in the second opening and in contact with the conductive material using a second process, wherein the second process has a second step coverage smaller than the first step coverage;
    grinding the second side of the substrate to expose the conductive material; and
    depositing a third barrier layer in physical contact with the conductive material within the opening using a third process, wherein the third process has a third step coverage different from the first step coverage.

2. The method of claim 1, wherein the first barrier layer comprises a first material and the second barrier layer comprises a second material different from the first material.

3. The method of claim 1, wherein the first barrier layer is a composite barrier layer.

4. The method of claim 3, wherein the depositing the first barrier layer further comprises:
   depositing a layer of titanium; and
   depositing a layer of titanium nitride.

5. The method of claim 1, wherein the first process is chemical vapor deposition and the second process is physical vapor deposition.

6. The method of claim 5, wherein the third process is physical vapor deposition.

7. The method of claim 1, further comprising forming a conductive connector adjacent to the third barrier layer.

8. The method of claim 7, wherein the forming the conductive connector comprises forming a copper pillar.

9. The method of claim 7, wherein the forming the conductive connector comprising forming a redistribution layer.

10. A method of manufacturing a semiconductor device, the method comprising:
    depositing a first dielectric layer over a substrate, the substrate having a first side and a second side;
    removing portions of the first dielectric layer to form a first opening with a first width;
    removing portions of the substrate through the first opening to form a second opening with a second width less than the first width;
    depositing a first barrier layer lining the first opening and the second opening, wherein the depositing the first barrier layer is performed at least in part using a first deposition process;
    filling a remainder of the first opening and the second opening with a conductive material;
    removing a portion of the second side of the substrate to expose the conductive material; and
    depositing a second barrier layer in contact with the conductive material within the second opening and the second side of the substrate, wherein the depositing the second barrier layer is performed at least in part using a second deposition process different from the first deposition process.

11. The method of claim 10, wherein the substrate further comprises a second dielectric layer adjacent the first dielectric layer.

12. The method of claim 10, wherein the depositing the first barrier layer further comprises depositing a composite barrier layer.

13. The method of claim 12, wherein the depositing the composite barrier layer further comprises:
    depositing a layer of titanium; and
    depositing a layer of titanium nitride.

14. The method of claim 10, further comprising a conductive connector adjacent to the second barrier layer.

15. The method of claim 14, wherein the conductive connector is a redistribution layer.

16. The method of claim 10, wherein the first deposition process is a chemical vapor deposition process and the second deposition process is a physical vapor deposition process.

17. A method of manufacturing a semiconductor device, the method comprising:
    forming an opening partially through a substrate;
    lining the opening with a first barrier layer using a first deposition process with a first step coverage;
    overfilling the opening with a conductive material;
    planarizing the conductive material with the substrate;
    depositing a planar second barrier layer in physical contact with the conductive material, the depositing the second barrier layer being performed at least in part with a second deposition process with a second step coverage less than the first step coverage;
    removing a portion of the substrate opposite the second barrier layer to expose the conductive material, the conductive material being planar with the substrate; and
    depositing a planar third barrier layer in physical contact with the conductive material, the depositing the planar third barrier layer being performed at least in part with a third deposition process with a third step coverage less than the first step coverage.

18. The method of claim 17, wherein the forming the first process is a chemical vapor deposition process.

19. The method of claim 18, wherein the second process is a physical vapor deposition process.

20. The method of claim 17, wherein the forming the first barrier layer further comprises:
    forming a layer of titanium; and
    forming a layer of titanium nitride.

* * * * *